United States Patent [19]

Fernandes

[11] Patent Number: 4,904,996
[45] Date of Patent: Feb. 27, 1990

[54] LINE-MOUNTED, MOVABLE, POWER LINE MONITORING SYSTEM

[76] Inventor: Roosevelt A. Fernandes, 104 Ruby Rd., Liverpool, N.Y. 13088

[21] Appl. No.: 145,506

[22] Filed: Jan. 19, 1988

[51] Int. Cl.$^4$ .................... G08C 9/06; G08C 19/22
[52] U.S. Cl. ....................... 340/870.07; 340/310 R
[58] Field of Search .............. 340/870.07, 870.17,
340/538, 657, 310 R, 310 A; 324/126, 127;
364/483, 492; 310/308; 307/64, 66, 129, 130;
318/16, 580, 732

[56] References Cited

U.S. PATENT DOCUMENTS

| | | | |
|---|---|---|---|
| 4,384,289 | 5/1983 | Stillwell et al. | 324/126 |
| 4,611,207 | 9/1986 | Anderson et al. | 324/126 |
| 4,635,055 | 1/1987 | Fernandes et al. | 340/870.17 |
| 4,646,006 | 2/1987 | Schweitzer, Jr. | 324/127 |
| 4,689,752 | 8/1987 | Fernandes et al. | 364/483 |
| 4,709,339 | 11/1987 | Fernandes | 364/492 |
| 4,723,220 | 2/1988 | Smith-Vaniz | 364/492 |
| 4,758,962 | 7/1988 | Fernandes | 364/483 |
| 4,818,990 | 4/1989 | Fernandes | 340/870.07 |

Primary Examiner—Gerald Brigance
Assistant Examiner—Richard Hjerpe
Attorney, Agent, or Firm—Charles S. McGuire

[57] ABSTRACT

A mobile system for monitoring electrical, physical and/or environmental parameters and conditions associated with or in proximity to an energized electrical power conductor supported on a succession of towers extending along a power corridor. In a first embodiment, the system includes front and rear propulsion modules surrounding the conductor and carrying a payload module therebetween. The propulsion modules include linear induction or rotary DC motors deriving power directly from the power conductor. The payload module carries equipment such as video and infrared cameras, and apparatus for lightning flash, ambient temperature, acoustic and corona detection, and a transmitter for relaying appropriate signals to a remote ground station. In another embodiment, the payload module is mounted upon a lightning shield wire of the power line and is connected to a propeller-driven helium blimp for movement along the wire. In both embodiments, the line-mounted equipment includes appropriate apparatus which allows movement thereof past obstructions on the line.

29 Claims, 8 Drawing Sheets

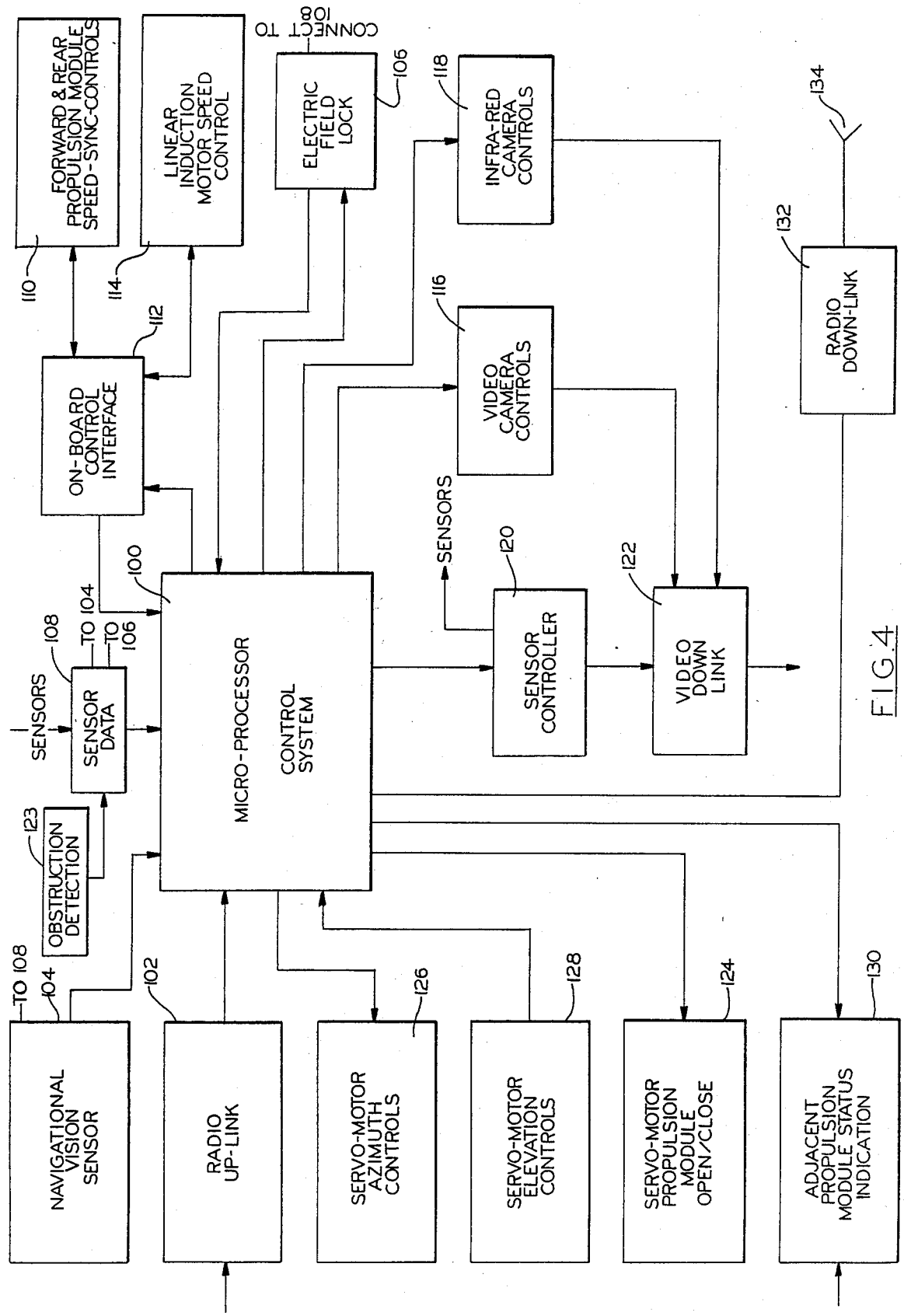

LINE-MOUNTED, MOVABLE, POWER LINE MONITORING SYSTEM

REFERENCE TO RELATED APPLICATIONS

This application is related to the following U.S. Patent Applications: Electrical Power Line and Substation Monitoring Apparatus and System, Ser. No. 859,496, filed May 5, 1986 now U.S. Pat. No. 4,758,962; Electrical Power Line Parameter Measurement Apparatus And Systems Including Compact, Line-Mounted Modules, Ser. No. 859,497, filed May 5, 1986, now Pat. No. 4,709,339; and copending application Monitoring Systems For Power Lines and Right-of-Way Using Remotely Piloted Drone, Ser. No. 95,152, filed Sept. 11, 1987 now U.S. Pat. No. 4,818,990; and copending application High Voltage Conductor Mounted Line Powered Monitoring System, Ser. No. 95,158, filed Sept. 11, 1987, the disclosures of which are incorporated herein by reference.

BACKGROUND OF THE INVENTION

The present invention relates to monitoring apparatus for gathering data and/or measuring parameters associated with or in the vicinity of high voltage power conductors. More specifically, the invention relates to monitoring systems mountable upon and movable along the conductors or shield wires of an EHV power transmission corridor. The monitoring system of the invention includes line-mounted modules carrying such equipment as video and infra-red imaging equipment, acoustic, RF, and ultra-violet corona detection sensors, current and voltage sensors, and sensors for measuring ambient temperature and conductor icing conditions. The mobile, line-mounted monitoring system would permit inspection of transmission line conductor support insulators for cracks, thermal monitoring of critical thermally limiting spans, degraded splice joints, inspection of tree-trimming requirements, tower condition monitoring and inspection of icing conditions.

These functions are performed today through a combination of foot patrols and manned helicopter fly overs. Foot patrols are, of course, labor intensive and expensive, as well as being subject to weather conditions. Manned helicopters are dangerous to fly along EHV transmission lines during inclement weather and are not good platforms for infra-red thermal imaging of 1" to 2" diameter conductors. Conventional helicopters are also more expensive to operate on a year round basis than the proposed conductor mounted robot vehicle. Prior art conductor mounted monitoring systems have been fixed or have had very limited monitoring capability compared to the systems disclosed herein.

OBJECTS OF THE INVENTION

The overall goal of the invention is to provide a cost-effective, reliable, multi-function, power conductor or shield wire mounted monitoring system that can transmit video imagery, infra-red thermal data, acoustic, RF, and ultra-violet corona emissions, conductor temperature, current, voltage and other sensor information as needed from the line-mounted and movable system to a remote location. Among the specific objects of the invention, within the context of power line monitoring and right-of-way inspection are:

to provide a self-propelled line powered system capable of travelling on energized power conductors while deriving its energy electromagnetically from the conductor power flow;

to provide a means for monitoring conditions along the power conductor and right-of-way using a video camera, infra-red thermal imaging, ultra-violet and acoustic sensors, and other sensors to detect conductor sag, icing conditions or other parameters to facilitate power transmission operating and maintenance functions; and to provide a means for detecting cracked insulator strings, frayed power conductors, degraded conductor splices, tower corrosion, tree growth, ground clearances, conductor spacer/damper conditions, and critical thermal spans along a transmission line by telemetering the information through a terrestrial radio or satellite communications link.

SUMMARY OF THE INVENTION

Apparatus for monitoring conditions along a power line and right-of-way using mobile, line-mounted apparatus is disclosed in the form of a robot vehicle propelled by energy from the conductor itself, or by battery power. The robot-vehicle is equipped with video, still camera, infra-red sensing and other sensor packages carried within or suspended below it. The preferred propulsion means comprises linear induction motors housed in toroidal or cylindrical shaped metal housings split into two hinged halves that can be actuated by servo-motors to allow the system to negotiate conductor support obstructions. Each of the linear induction motor housing hubs are constructed with an air gap sufficient to allow the linear induction motor to ride on an air cushion that clears the conductor splices.

When the robot vehicle reaches an obstruction, such as a conductor support connected to a tower, servo-motors cause the trailing linear induction motor housing to drop and re-attach itself on the conductor around the obstruction. The procedure is repeated in a hand-over-hand fashion and then the robot monitoring vehicle continues its forward motion beyond the tower support obstruction. The entire assembly, including the forward and rear linear induction motor propulsion modules and the central payload module carried between the two, can be mounted on or removed from an energized high voltage conductor using two bucket truck crews, mounting the two propulsion modules simultaneously, using hot-sticks. The two propulsion modules have a hinge mechanism for mounting similar to that used in the sensor modules described in Pat. Nos. 4,689,752 and 4,709,339. The video and infrared cameras are automatically trained on the conductor by sensors that operate the servo-motors controlling the cameras. The cameras are movable in both elevation and azimuth by servo-motors inside the payload module which may be controlled from a remote location having monitors for viewing the data transmitted by the cameras.

A mobile ground station fitted with RF transmit and receive antennas and a microcomputer driven console with a broad band video receive link is used to control all operations of the line-mounted equipment, sometimes referred to as a robot RPV (remotely powered vehicle). Operation of the still camera, video camera, or infrared imaging can be controlled from the ground station by the operator to obtain specific detail of interest. The robot-RPV can be stopped next to insulator strings with all on-board motors, cameras, etc. shut-off to allow acoustic and RF measurements to be made of corona discharges from any cracked insulator strings.

Installation and removal of the robot-RPV can be carried out at substation sites or at any intermediate point along a transmission line.

Light weight video cameras and sensing systems with on-board microprocessors having over 1 Megabyte RAM memory are used. In addition, a light-weight fiber optic "endoscope" probe is used for close-in imaging to inspect frayed conductor hot spots detected through the thermal imager. Communication to and from the robot-RPV are carried out from a mobile ground station using L-band, 2-way digital RF communications.

A second robot-RPV configuration for monitoring EHV transmission lines uses a remotely-piloted vehicle which is mounted on one of the shield wires of an EHV power transmission line. The obstructions along the shield wire are much easier for the vehicle to negotiate. Above the three-phase power conductors, a tethered, helium filled, propeller driven gasoline or wind propulsion system is used to propel the monitoring system along the shield wires. Servo-controls are used to operate the rudder so that the helium-blimp moves the robot-RPV, using Kevlar tethers fixed to it, along the shield wire. The shield-wire mounted robot-RPV carries all the video-camera, infra-red thermal imaging, sensor equipment, as well as a pair of manipulator arms, all of which are powered by rechargeable battery packs. Sensors aboard the robot-RPV detect a shield wire support obstruction at a tower and cause the manipulator arms to extend forward over the obstruction and then clamp onto the shield wire on the side of the obstruction away from the robot-RPV. At this point servo-controlled motors open the split hinged jaws of the robot-RPV. The helium-blimp lifts the robot-RPV above the obstruction and forward. Once past the obstruction, altitude controls lower the robot-RPV over the shield wire, the servos clamp the unit around the shield wire and forward motion resumes.

At distances of, e.g., about 10 miles, tower-mounted recharging stations are positioned to recharge the robot-RPV batteries. The recharging stations themselves receive power through high powered laser diodes fed by a stationary phase conductor mounted modules, as described in related applications.

BRIEF DESCRIPTION OF THE DRAWINGS

FIG. 4 is a system block diagram of a typical operating and control system for a robot-RPV such as that of the preceding Figures;

DESCRIPTION OF THE INVENTION

Figure 1:
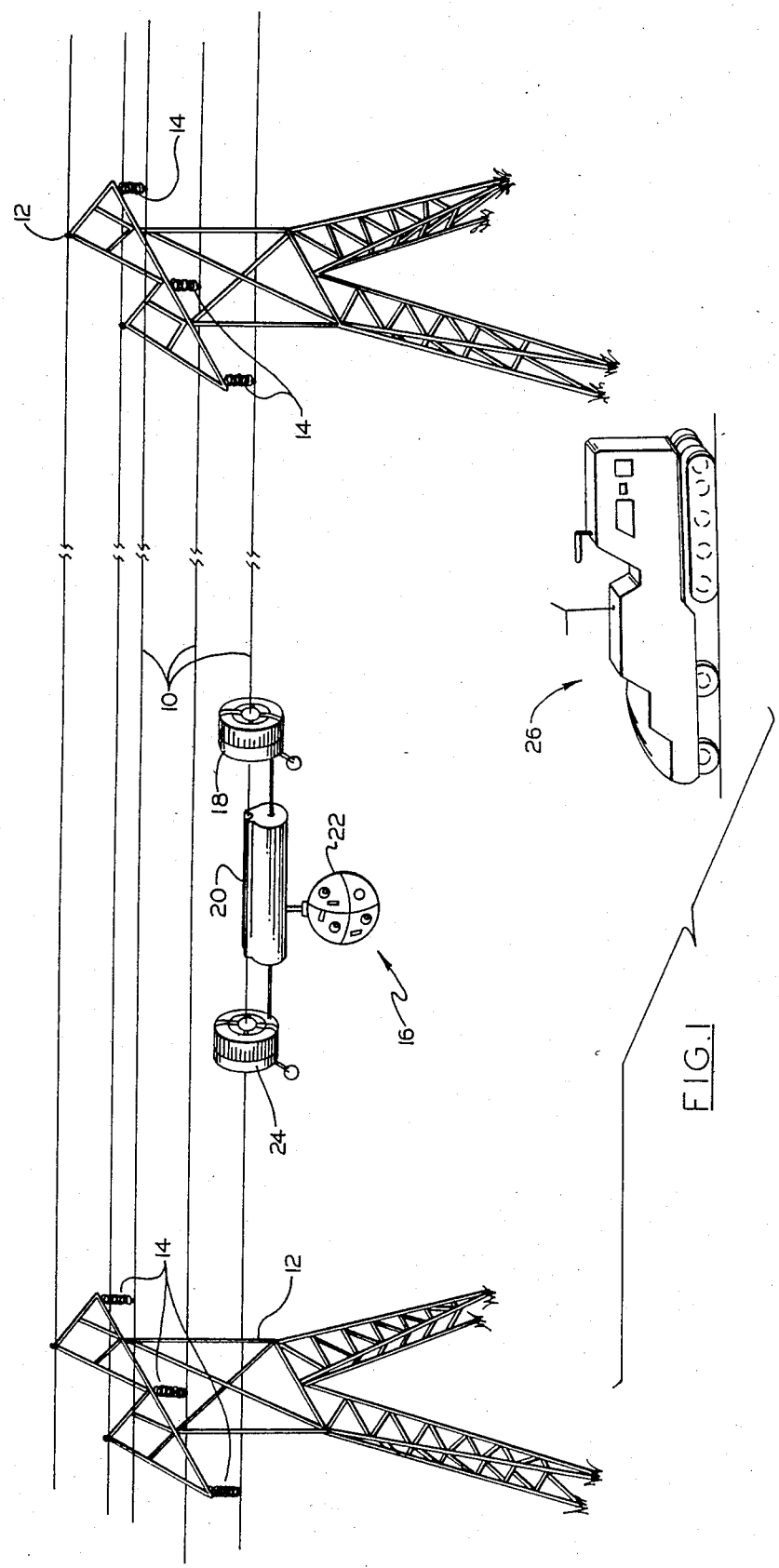
FIG. 1 is a general perspective view of a first embodiment of the robot-RPV of the invention mounted upon a phase conductor of an EHV power transmission line with a ground based vehicle which receives and transmits signals from and to the line-mounted equipment.

FIG. 1 shows a remote perspective of an EHV power line segment with 3-phase power conductors 10 supported between transmission towers 12, by means of insulator strings 14. The self-propelled remotely piloted, power line monitoring system of the present invention is indicated generally by reference numeral 16. There are three main components of the energized conductor mounted, robot-RPV 16, namely, forward propulsion module 18, payload subsystem module 20 carrying video imaging, infra-red imaging and other sensors 22; and rear propulsion module 24, identical to module 18. Modules 18 and 24 each include a linear induction motor driven subsystem, with an inductively coupled power supply drawing energy from the conductor, with a 2-way remote communications interface and antenna.

A mobile ground control station 26 is equipped with transmit and receive RF antennas and a microprocessor controlled twin display console. The mobile ground control station is equipped with digital data storage capability and can store video imagery, superimposed infra-red scans and other sensor telemetry in a digital format.

Figure 2:
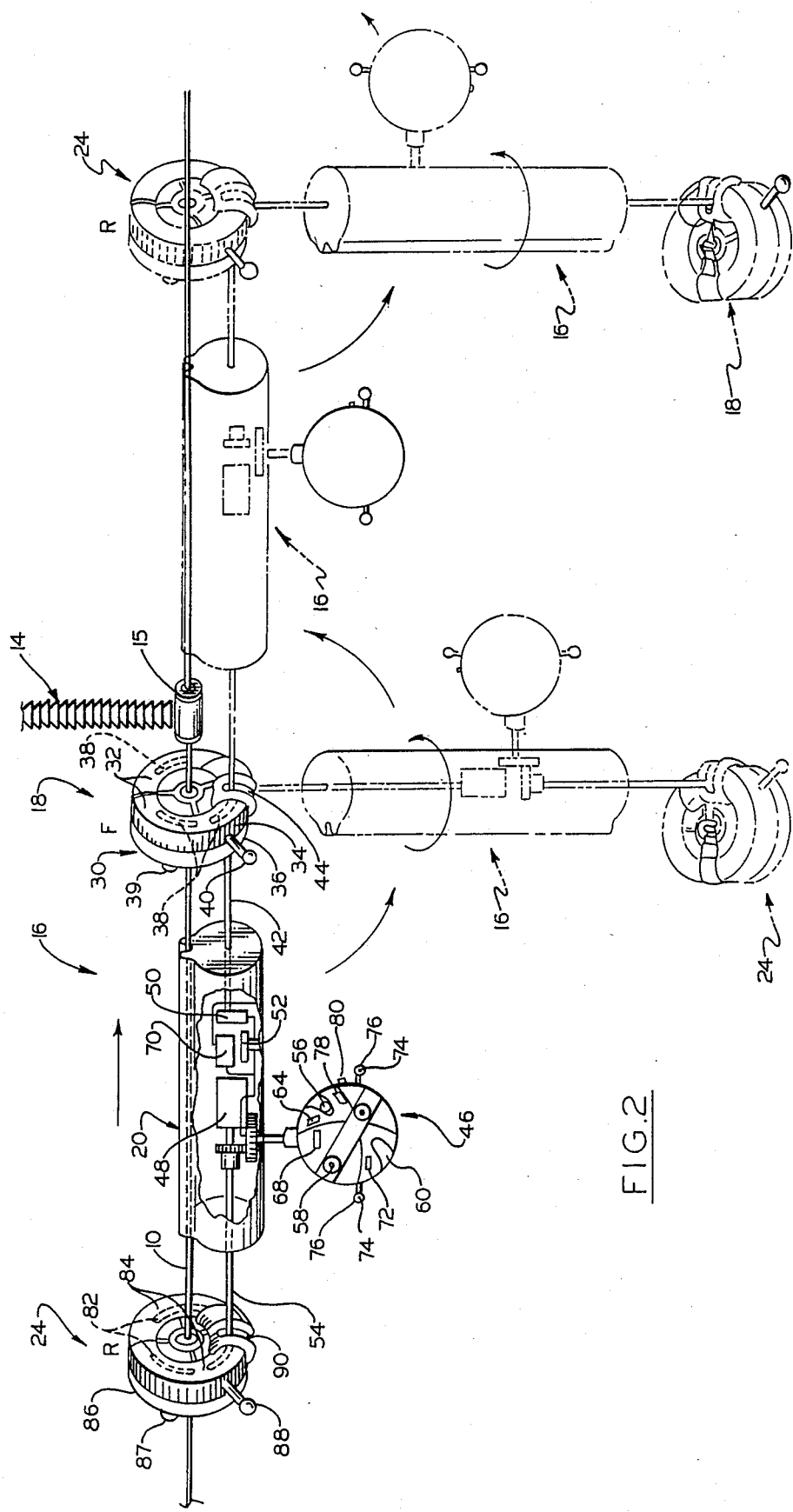
FIG. 2 is a perspective view of the robot-RPV of FIG. 1, showing the manner of movement thereof past an obstruction on the conductor.

FIG. 2 shows a close-up of the monitoring system 16. The forward propulsion system 18 comprises a split cylindrical shaped cast aluminum housing 30, constructed in a manner similar to the sensor modules disclosed in patent application Ser. No. 859,496. In addition to being split into two semi-circular halves 32 the propulsion module is split into front 34 and rear section 36 in a plane transverse to the conductor axis. Linear induction motor windings 38 are housed within the front section 34 of the cylindrical propulsion module, while the rear section 36 contains the power supply, communications, processing and control equipment arranged in a manner similar to the configuration of application Ser. No. 859,496. RF communications between the sensor module 18 and remote control ground station 26 is achieved through receive antenna 39 and transmit antenna 40. A high strength tubular Kevlar shaft 42 interconnects the forward propulsion system 18 with the payload module 20 through a hinged servo-motor coupling 44. Electrical and/or optical interconnections between the forward propulsion module 18, the payload module 20 and rear propulsion module 24 are made through the Kevlar tubular connection 42 which can also support the weight of both the payload 20 and rear propulsion module 24. The payload pack 20 is made of cast aluminum and carries a video imaging and infra-red imaging module 46. Servo-motors 48 allow the video and infra-red imaging cameras to be adjusted in azimuth or elevation. Communication card 50 housed within the payload sensor module 20 allows communication between the forward propulsion module and the ground control station to be passed on to the sensor control cards 52. Communications from the ground control station can be directed to either the forward propulsion module 18 or the rear propulsion module 24 through digitally encoded RF transmissions keying either the forward or rear propulsion module receivers which are connected through the hollow tubular shafts 42 and 54. Commands transmitted to the payload module from the ground control station actuate DC servo-motors 48 causing the video and infra-red imaging module 46 to rotate for azimuth control. The video camera 56 moves on tracks within module 46, driven by DC servo motors within module 46 for elevation control of the video camera. Similarly, DC servo-motors control the infra-red imaging camera 58 on tracks within the spherical segmented cast aluminum housing 46, with transparent windows 60 for the video camera and 62 for the infra-red imaging camera. Video camera card 64 and infra-red camera card 68 are connected to down link communications interface and modulation card 70. The down link data can be encoded if necessary. Corona RF, ultraviolet, and lightning flash charge coupled sensor card 72 is connected to corona RF, ultraviolet, and charged coupled lightning flash detectors 74 enclosed in four symmetrically spaced transparent plastic spherical housings 76. Acoustic sensor card 78 is connected to a corona and lightning acoustic detector 80. The sensor connections to a multiplexer, A/D converter, microprocessor and RF circuitry are described in Ser. No. 859,496. The voltage, current, temperature, lightning, flash, RF corona and other sensor descriptions and circuit connections are disclosed in Ser. Nos. 859,496, 95,152 and 95,158.

The rear propulsion module 24 which is identical to forward propulsion module 18 has linear induction motor propulsion windings 82, mounted inside split forward cast aluminum housing section 84. Rear segment 86 carries a split AC power pick-up core, transformer coils and power supply with rechargeable battery energy storage means. The rear propulsion module is also equipped with receive antenna 87 and transmit antenna 88. Hollow tubular Kevlar support 54 connects the payload module 16 through a servo-actuated hinge 90 similar to hinge 44. All communications and redundant power supply connections between the rear propulsion and payload modules are made through the tubular connection 54.

Either the forward or rear propulsion modules are capable of meeting the payload module power requirements. Additional power, depending on payload requirements, can be provided by housing an iron-core pick-up coil in the payload module, arranged to inductively capture energy from the power conductor 10. The power supplies within the propulsion module segments 36 and 86 are designed to individually meet the power requirements of the propulsion motors, servo-motors, sensor payload, communications and control electronics within all modules. The power supplies are essentially redundant so that when one of the propulsion modules is disengaged from the conductor as described below, all power requirements are met by the propulsion module that is surrounding the conductor.

When the self-propelled monitoring system 16 approaches an obstruction 15, at the suspension insulator 14 support point, the sensors which provide feedback to the navigation and control system slow down movement of the system along the conductor. As the forward propulsion module 18 reaches the obstruction, servo-motors within the rear propulsion module 24 open the rear-propulsion module by actuating the hinge mechanism 90. The rear-propulsion module 24 and payload module 16 drop free of the conductor 10 to the vertical position shown dotted in FIG. 2. Servo-motors within the forward propulsion module 18 rotate the payload module and rear-propulsion module 24 180° about the vertical axis. After the rear propulsion module is rotated 180° in azimuth, servo-motors within the cylindrical module 18 surrounding the conductor swivel the suspended assembly in a vertical plane an additional 90° so that the semi-open cylindrical propulsion module 24 can be snapped around the conductor beyond the obstruction 15. An optical alignment system with "vision sensors", either in an automatic mode or through a teleoperator, and servo-motors within module 24 help reclamp the rear propulsion module 24 around the conductor. Once this is accomplished, and propulsion module 24 is powered up by the energized power conductor 10, a control signal is communicated to propulsion module 18 causing its servo-motors to operate the hinge mechanism opening the module and dropping it free of conductor 10. Servo-motors within module 24 then rotate module 18 by 180° in azimuth. Servo-motors within module 24 then swivel the payload module 16 and module 18 in a vertical plane. As before, the optical vision system or a teleoperator guides the module 18 to a clamping position around conductor 10. Servo-motors within module 18 then clamp the module around the conductor and the robot vehicle resumes forward motion after the linear induction motor windings are energized in the forward and rear propulsion modules.

The video and infra-red cameras are automatically trained on the conductor by sensors that operate servo-motors which drive the gimballed cameras on track mounts. These cameras are controlled in azimuth and elevation through closed-loop feedback controls or by operator command from the ground control station 26. In the teleoperator mode all start, stop, sensor and camera (video or infra-red) functions can be controlled from the operator CRT console in the mobile ground control station 26. The operator can control zoom, pan and tilt camera functions, for instance, to obtain specific detail of interest or to obtain panoramic views of the right-of-way to establish tree-trimming requirements, effectiveness of shrub control for environmental studies, etc.

Photographs can be taken of insulator strings exhibiting corona emissions which are detected by acoustic, RF and ultra-violet sensors. Video data is transmitted to the ground station in digital format. Digital infra-red data on conductor hot-spots is super-imposed on the video imagery for spatial correlation of data. All data is stored in digital format in the ground control microcomputer handling processing and data storage functions.

All conductor mounted electronic modules are housed in weather proof enclosures so that the system can operate in all weather conditions. The metallic housings are arranged so that no conducting, short circuit loops enclose the flux field. The forward and rear propulsion modules along with the payload module can be installed on energized power conductors using 2 or 3-man bucket crews in a manner similar to that described in patent application Ser. No. 859,496.

Figure 3B:
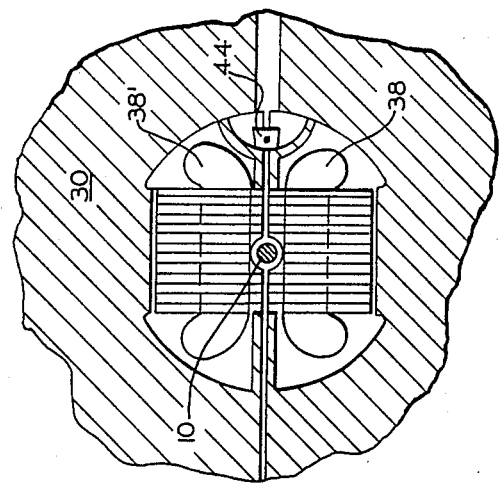
FIG. 3B is an end view in section on the line 3B—3B of FIG. 3A.
Figure 3A:
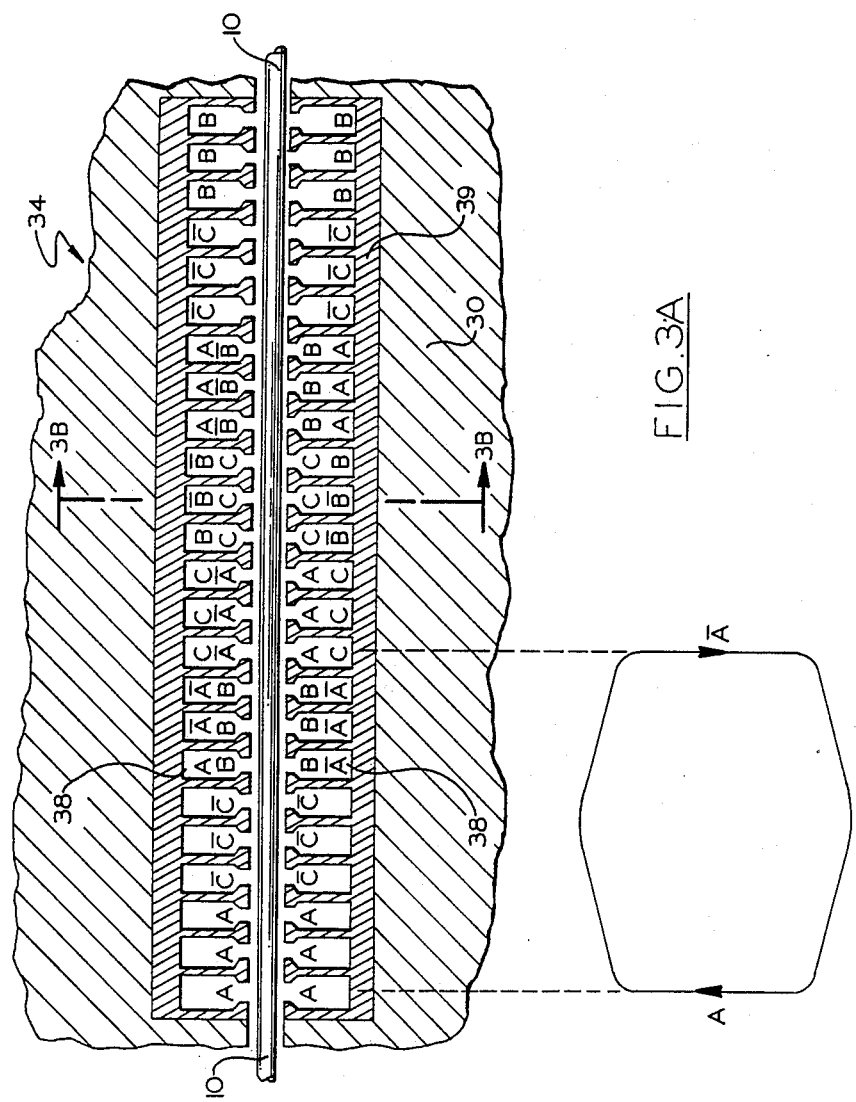
FIG. 3A is a somewhat diagrammatic, elevational view of a portion of the robot-RPV of FIGS. 1 and 2, in vertical section.
Figure 3C:
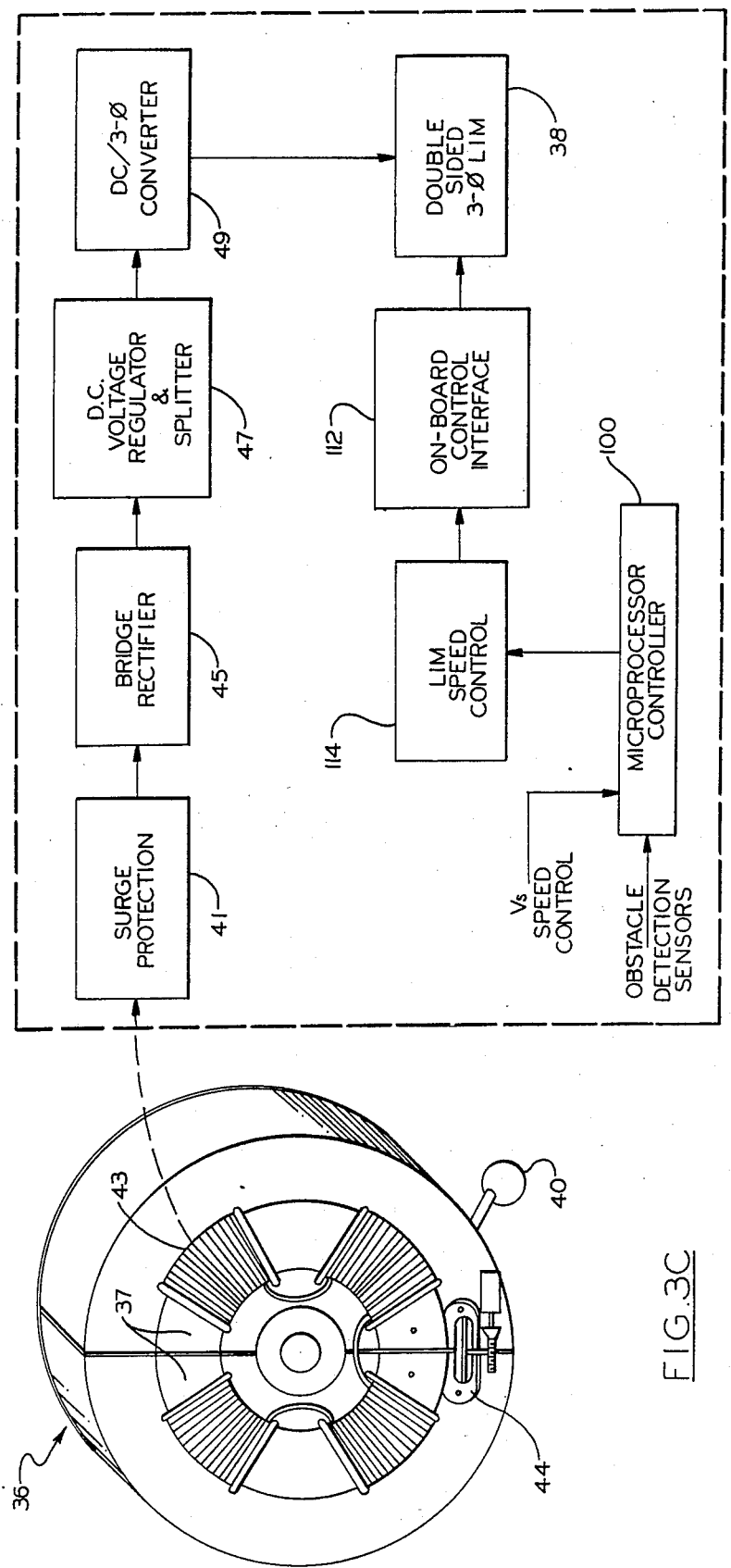
FIG. 3C is a somewhat diagrammatic, perspective view of another portion of the robot-RPV, together with a block diagram showing the operational relationship of electronic components carried therein.

As described later, further details of the linear induction motor of module 18 are shown in FIGS. 3A and 3B. Also, additional details of rear segment 36 of module 18 are shown in FIG. 3C, together with a block diagram of the electronics housed therein.

FIG. 4 shows a block diagram of the propulsion module controls and sensor/communications system. Identical systems are included in both the forward and rear propulsion modules. This provides both redundancy and an ability to communicate with either propulsion module in situations when one module is off the conductor.

The microprocessor control system 100 is capable of autonomous operation so that the conductor mounted system operates as a true robot for conductor and right-of-way monitoring. Alternatively, a telerobot operating mode can be selected with control commands communicated from the mobile ground station through radio up-link receiver 102. Navigational vision sensors 104, and electric field lock sensor 106 outputs are fed to the microprocessor control system 108. Acoustic, corona RF, ultra-violet, infra-red, ambient air temperature, module speed and propulsion module open/close positions are fed through a sensor interface 108 to the micro-processor control system. This information is used to control the speed and direction of the conductor mounted RPV monitoring system along the power conductor. Forward and rear propulsion module speed synch signals 110 are fed through the on-board control interface 112 to the microprocessor controller and used to control the linear induction motor speed through the linear indiction motor speed control module 114.

In the teleoperator mode, video and infra-red camera controls are communicated to the microprocessor controller through receiver 102 and these signals are used to operate the video camera zoom, pan and tilt controls 116 or the corresponding infra-red camera controls 118. Sensor controller 120 provides a control interface with the different sensors under the direction of the microprocessor control system 100. Broad band video camera signals and infra-red camera images are multiplexed before being down-linked to the ground station receiver via module 122.

As an obstruction is detected by optical or acoustic sensing means 123 mounted in the forward propulsion module 18 the robot vehicle is slowed down by the microprocessor control system 100 controlling the field of the linear induction motors. Once at rest next to the obstruction the microprocessor operates the servo-motor propulsion module open/close controls 124 which actuate the hinge mechanism 90 dropping the Rear Propulsion module free from the conductor. The microprocessor controller next operates the servo-motor azimuth controls 126 which turn the propulsion module to the proper orientation prior to the servo-motor elevation controls 128 being actuated to swing the payload and rear propulsion module around the obstruction and around the conductor. The servo-motor controlling the hinge mechanism of rear propulsion module 24 is actuated to close the module around the conductor. Position status information on the propulsion module which is disconnected from the conductor is communicated to the other, connected module through interface 130. All data other than video and infra-red imaging information is downlinked through RF module 132 and antenna 134 in the 950 MHz band in a manner analogous to the disclosure in Ser. No. 859,496. RF receiving antennas at both the 950 MHz and video downlink frequencies are located on the ground receiving station.

FIG. 3A shows a cross section of the front segment 34 of the forward propulsion module 18. The 3-phase stator windings 38 with end connections 38' are shown, for the double sided (or tubular) linear induction motor, housed within laminated and slotted iron core 39 and surrounded by cast aluminum housing 30. Housing 30 acts as a shield for the stator winding 38 preventing any coupling with current flowing through power conductor 10. The aluminum covered steel reinforced power conductor 10 forms an "infinite rotor" for the linear induction motor, propelling module 34 along the conductor. The cast aluminum housing is opened and closed around conductor 10 through the servo-motor driven hinge 44.

FIG. 3C shows the rear segment 36 of the forward propulsion module 18 with its split hinged iron core 37 and power supply transformers 43. Servo-motor driven hinge mechanism 44 allows the iron core to open and close around power conductor 10. The four transformer secondary coils wound on bobbins around split core 37 are connected in parallel. The power supply configuration is similar to that disclosed in application Ser. No. 859,496. AC energy electromagnetically coupled to the transformer secondaries is fed through surge protection circuitry 41 to a bridge rectifier 45, DC voltage regulator and splitter circuitry 47. The splitter circuitry is used to provide low voltage DC power for the various electronic sensor and control circuitry. Regulator-splitter 47 also provides DC power to DC/AC converter 49. This converter uses standard circuitry for converting DC power to 3-phase AC power which is fed to the stator windings 38 of the double sided (or tubular) linear induction motor. The microprocessor controller 100 uses feedback signals from speed sensors and obstacle detection sensors to control the speed of the linear induction motor through the motor speed control circuitry 114 and on-board control interface module 112.

Figure 5A:
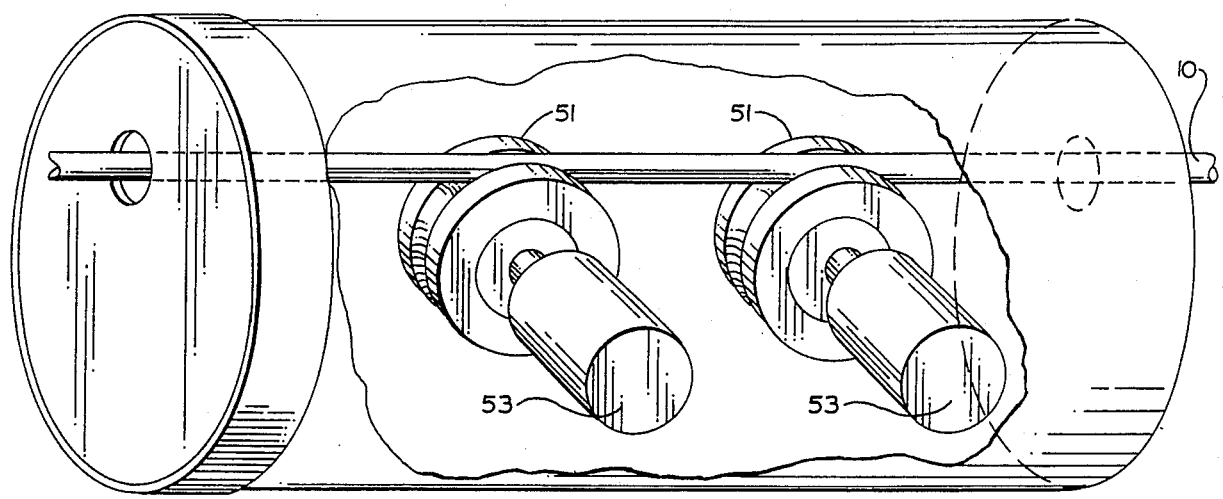
FIG. 5A is a somewhat diagrammatic, perspective view, with portions broken away, of an alternate propulsion system for the robot-RPV.

FIG. 5A shows an alternate DC motor propulsion system employing grooved rollers 51 and DC motors 53. Unlike the linear induction motor propulsion this results in frictional contact with power conductor 10 but provides for a simpler power supply, as it eliminates need for a DC/3-phase converter. This approach would also provide simpler speed controls. However, for critical power transmission lines it is important to select roller material that will not cause conductor wear with time.

Figure 5B:
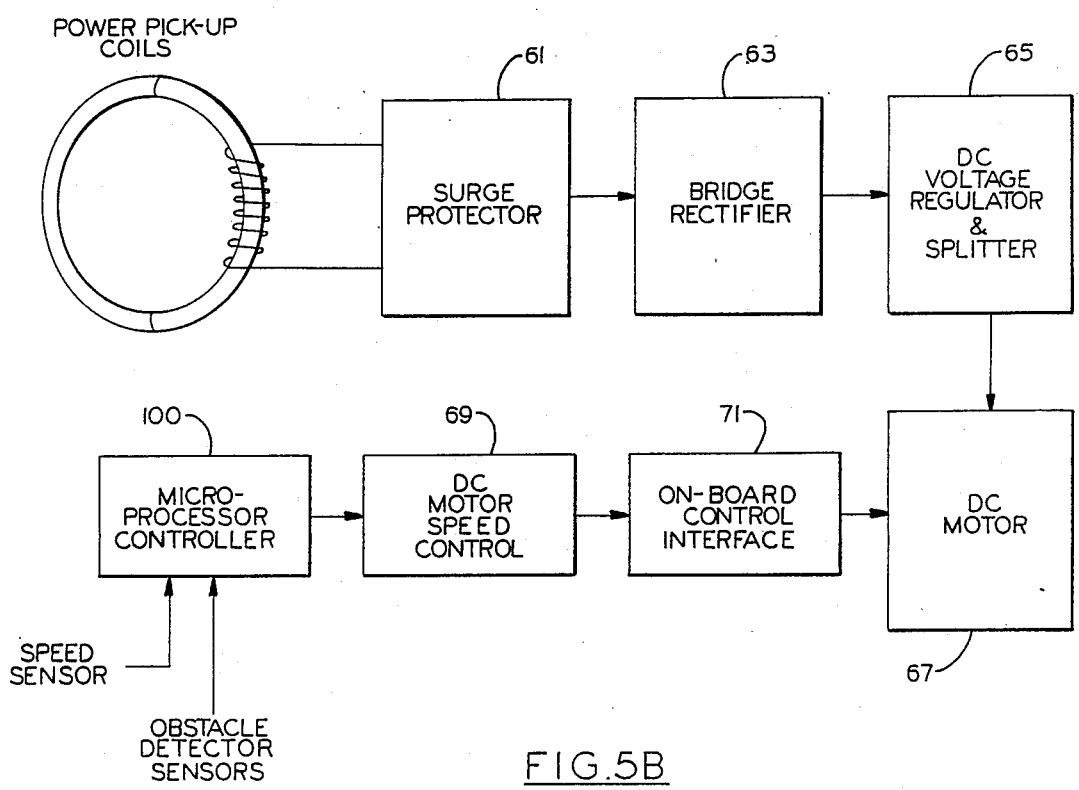
FIG. 5B is a block diagram showing the operating and control elements of the propulsion system of FIG. 5A.

FIG. 5B shows the power supply simplification possible with the DC motor propulsion system. AC power is fed through surge protection module 61, bridge rectifier 63, to DC voltage regulator and splitter 65. The regulated DC power is fed to DC propulsion motors 67. The microprocessor controller 100 uses speed sensor and obstacle detection sensor feedback to control the DC motors 67 through DC speed control circuitry 69 and on-board control interface 71. Again, the descriptions for the forward propulsion module apply to the rear propulsion module 24.

In constructing the propulsion and payload modules care is taken to shield all electronic circuitry and to avoid short circuit loops encompassing the flux field. This is accomplished through insulated, circumferential splits in the module housings which are sealed by moisture proof gaskets. For transient shielding, high frequency capacitive shunts are used across the gaps to prevent transients from damaging electronic circuitry within the various modules. Hot-stick mounting techniques are used to install the various modules on a high voltage power conductor using bucket truck crews.

Figure 6:
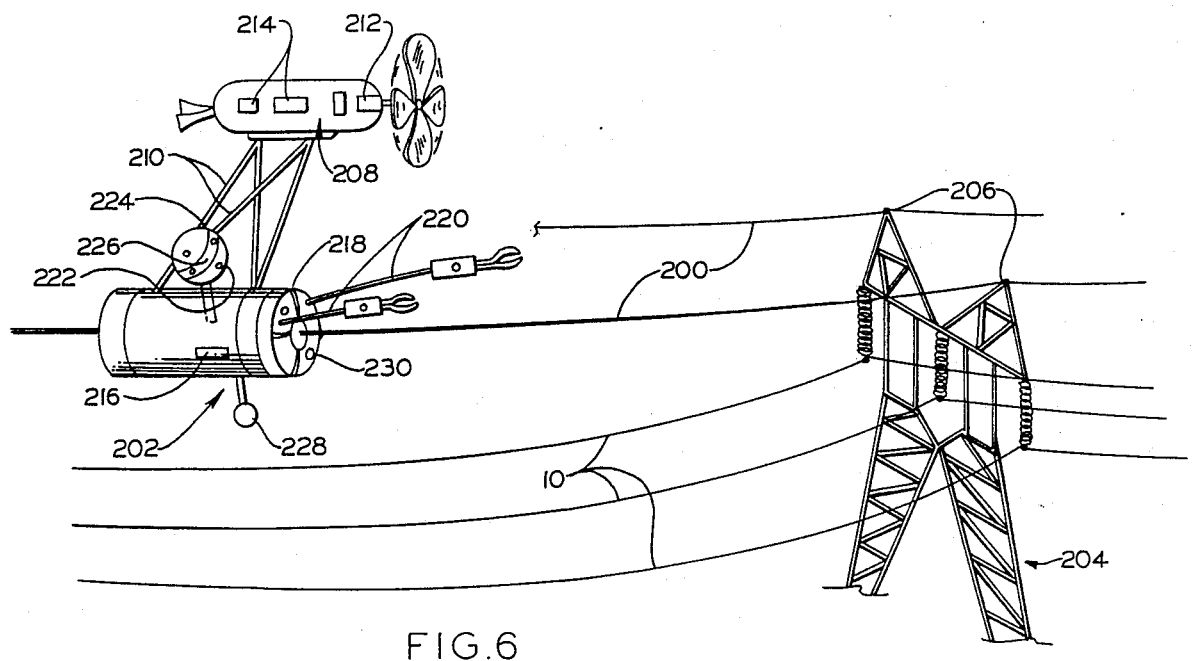
FIG. 6 is a perspective view of another embodiment of the robot-RPV, adapted for mounting upon and movement along one of the lightning shield wires of the power line.
Figure 7:
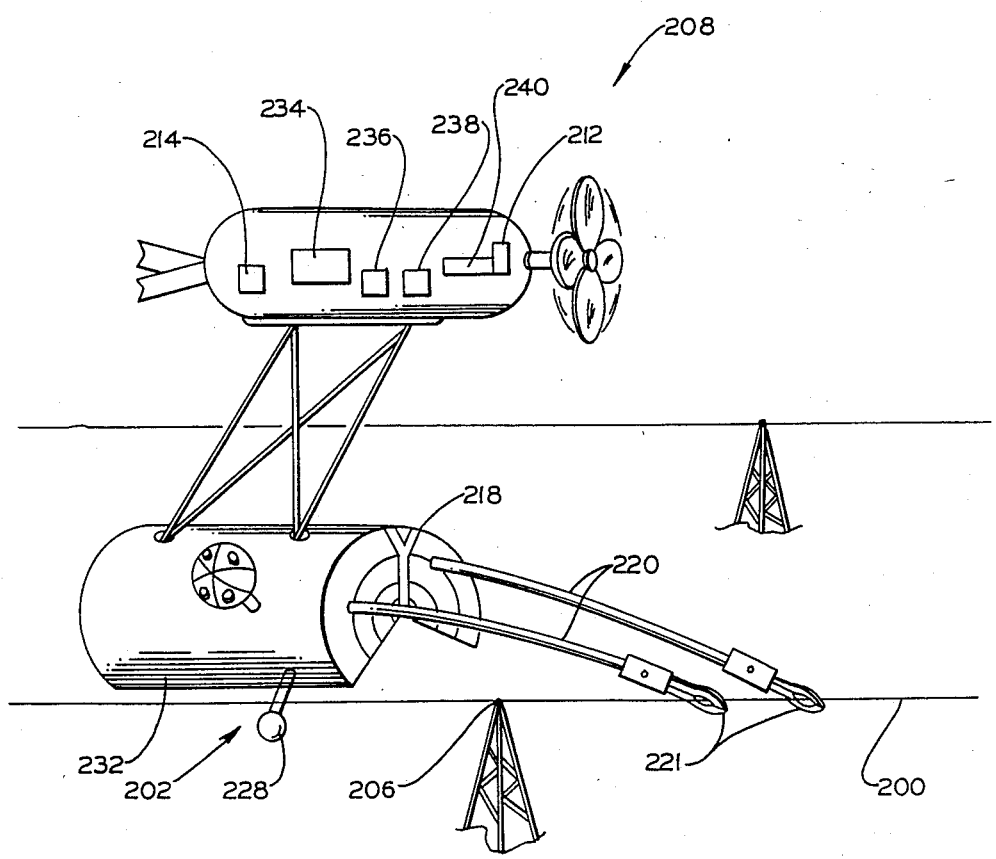
FIG. 7 is a perspective view showing the manner of movement of the robot-RPV of FIG. 6 past an obstruction on the shield wire.

FIG. 6 shows another form of conductor mounted robot-RPV apparatus 202 using one of the lightning shield wires 200 as the guide wire. Since the shield wires are placed at the highest points on electric power towers 204 and are grounded to the tower, obstructions 206 that have to be negotiated at each tower are small. Furthermore, the shield wires have very small sags and as they do not carry power they do not have the variable sags associated with the phase conductors. In this configuration, since power cannot be conveniently derived from phase conductors in a continuous fashion, power for propulsion is derived through a wind powered, or gasoline-powered, helium blimp 208 built entirely from insulating material. The propeller-driven helium blimp 208 is connected to the conductor mounted module 202 by Kevlar high strength tethers 210 carrying fiber-optic communication links between microprocessor interface 212 and servo-controls 214 on-board the helium blimp and servo-system controls 216 for the hinge mechanism 218 of split cylindrical housing of module 202 and manipulator arms 220. Payload module 222 is mounted on the module 202 with azimuth controls and controls for the video camera 224, infra-red camera 226 and other sensors arranged in a manner similar to the previous phase conductor configuration except that the payload module is mounted above module 202. Transmit RF antenna 228 and receive RF antennas 230 are also provided for communications with the ground control station as disclosed for the previous configuration. Night vision and infra-red sensing capability provides the traveling module with imaging capability under a wide range of ambient conditions. In the tele-robot mode, an operator sitting in front of a CRT video console in the ground control mobile unit, observes imagery transmitted from the monitoring system and can "pilot" the monitoring device along the shield wire and around tower obstructions. When nearing an obstruction appropriate sensors on module 202 begin to slow the forward travel of blimp 208. The arms 220 are extended by servo-motors operating under control of the microprocessor with command signals received from the operator's console in the manual mode. Once arms 220 are past the obstruction 206, clamps 221 on the ends of the arms are dropped over the shield wire 200 and loosely clamped around it, as shown in FIG. 7. After the sensors verify that clamps 221 are firmly around the conductor, feedback signals cause the solenoid actuated hinge 218 of the cylindrical housing to open. The helium blimp 212 lifts the housing 232 above the conductor and moves it forward over the obstruction 206, while pushing the arms 220 forward. During this time the on-board controls of the helium blimp are actuated by the operator in manual mode, to keep the housing 232 above the obstruction. Once past the obstruction the housing 232 is lowered over the shield wire and the solenoid actuated hinge is closed around the shield wire. The tethered flight continues with the helium blimp providing the power for the module propulsion and power transmission line/right-of-way surveillance. Rechargeable batteries, and if necessary solar panels provide power for the servo-motor controls 214, solenoid actuators, and all the payload electronic systems. The rechargeable battery power supply within housing 232 also supplies power to the opto-electronic cards 234, sensor electronics 236, and power supply interface electronics 238 to augment power from power converter 240 within the helium blimp.

Figure 8:
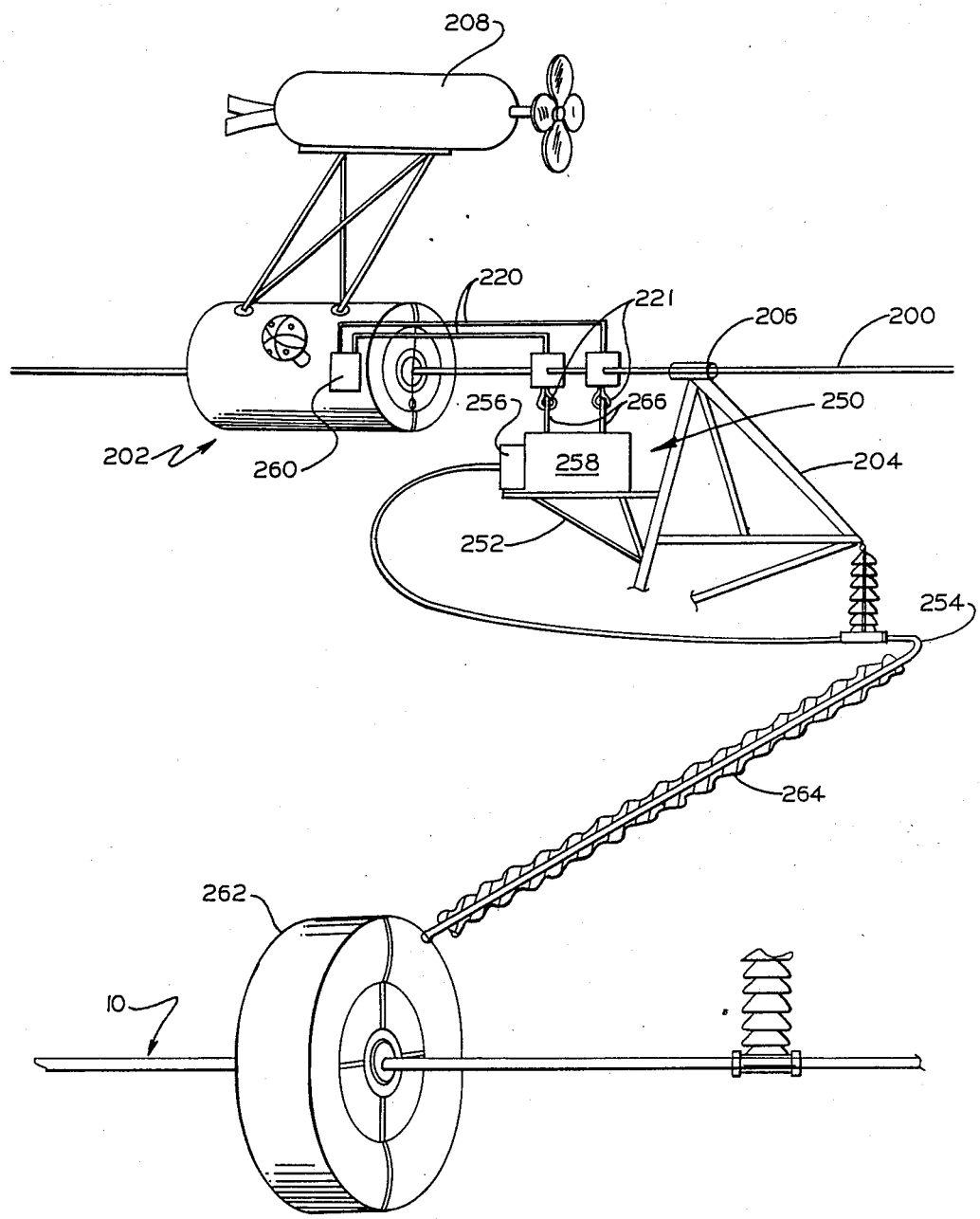
FIG. 8 is a perspective view showing a system for recharging the batteries of the robot-RPV of FIGS. 6 and 7.

FIG. 8 shows a battery recharging station 250, mounted on a platform 252 supported on tower 204. Optical waveguide 254 connects opto-electronic trickle charging circuitry 256, and rechargeable booster battery 258 with conductor mounted module 262. For remote EHV power transmission line monitoring it is inconvenient and expensive to have to manually remove and recharge batteries from conductor mounted devices. Strategically placed rechargeable battery stations are desirable. However, means must be provided to automatically recharge the power source for quick charging the robot-RPV batteries. This is done utilizing a module 262 such as that disclosed in application Ser. No. 859,496. Since module 262 captures power from the power line phase conductor 10 at full line potential, an optical power waveguide 254 is used to transmit power to the opto-electronic trickle charging circuitry 256 mounted on platform 252 at ground potential. The optical waveguide 254 is housed inside a tower mounted insulator string 264. Power from the phase conductor is captured by the split toroidal iron core within module 262, converted to DC power for operating a high power laser diode. Optical power from the laser diode is transmitted through the large core optical fiber waveguide 254. The optical power is converted to DC power by opto-electronic circuitry 256 to trickle charge battery bank 258. When the robot-RPV reaches the charging station the robot-manipulator arms are directed by the on-board cameras and opto-electronic feedback circuitry to clamp onto the recharging terminals 2669 Servo-motors actuate the clamps 221 to firmly engage the quick-charge battery terminals 266 which recharge the robot-RPV battery 260. Once the on-board battery is recharged, clamps 221 are released, arms 220 are retracted and the monitoring function is resumed. The recharging station intervals depend on the size of the on-board battery 260, payload power requirements, average operating speeds and desired recharging rates.

What is claimed is:

1. A mobile system for monitoring electrical, physical and/or environmental parameters and conditions associated with or in proximity to an energized electrical power conductor supported by insulators on a succession of towers extending along a power corridor, said system comprising:
   (a) at least two toroidal propulsion modules;
   (b) means for mounting and removing each said toroidal propulsion module to and from said energized conductor;
   (c) each said propulsion module including means powered by current flowing through said conductor for moving said propulsion module upon and along said conductor;
   (d) means mounted to and movable with said propulsion modules for carrying equipment including means for imaging, measuring, sensing and/or recording data commensurate with at least one of said parameters and conditions at selected positions in proximity to said propulsion modules as the latter moves along said conductor;
   (e) means for transmitting said data via an RF link; and
   (f) means for receiving said data at a location remote from said conductor.

2. The invention according to claim 1 and further including means for moving said propulsion modules from a position on one side of a conductor insulator support obstruction to a position on the opposite side of said obstruction.

3. The invention according to claim 2 and further including means for powering said mobile system around said obstruction and means for physically supporting said system simultaneously on both sides of said obstruction.

4. The invention according to claim 1 wherein said propulsion module comprises at least one linear induction motor.

5. The invention according to claim 4 wherein said linear induction motor is reversible for moving said propulsion module in either forward or reverse directions upon said conductor.

6. The invention according to claim 1 and further including control means for said propulsion module, and means for selectively operating said control means via an RF link from a location remote from said conductor.

7. The invention according to claim 6 wherein said toroidal propulsion module surrounds said power conductor when mounted thereon.

8. The invention according to claim 7 wherein said toroidal propulsion module comprises a plurality of hingedly connected sections, a central hub portion and means for moving said hingedly connected sections between open and closed positions, and wherein said hub portion loosely surrounds said conductor for levitated linear movement thereon when said propulsion module is mounted upon said conductor and said hingedly connected sections are in said closed position.

9. The invention according to claim 1 wherein said mobile system includes forward and rear propulsion modules, housing means for said equipment, and means connecting said forward and rear propulsion modules to said housing means on opposite sides thereof.

10. The invention according to claim 9 wherein said forward and rear propulsion modules are interchangeable between forward and rear positions with respect to the direction of movement of said mobile system.

11. The invention according to claim 10 wherein said forward and rear propulsion modules each comprise a plurality of hingedly connected sections, a central hub portion and means for moving said hingedly connected sections between open and closed positions, and wherein said hub portion loosely surrounds said conductor for levitated linear movement thereon when said propulsion modules are mounted upon said conductor and said hingedly connected sections are in said closed position.

12. The invention according to claim 11 and further including means detecting a conductor insulator support and means for moving said rear and forward propulsion modules from one side to the other of said support including means for sequentially moving said hingedly connected sections of said forward and rear propulsion modules between said open and closed positions, and means for rotating each of said propulsion modules relative to the other about a horizontal axis transverse to said conductor for movement of the open module away from said conductor as the closed propulsion module remains mounted to said conductor and supplies necessary power.

13. The invention according to claim 12 and further including control means for moving said hingedly connected sections and for relatively moving said propulsion modules, and means for selectively operating said control means from a location remote from said conductor using an RF link.

14. The invention according to claim 1 wherein said imaging equipment is of the type having a viewing direction, and further including means for controlling the direction of view of said equipment by control signals transmitted from a ground station RF transmitter.

15. The invention according to claim 14 wherein said equipment comprises a television and/or infrared camera.

16. The invention according to claim 1 wherein said measuring and sensing equipment comprises apparatus for detecting one or more weather parameters and means for transmitting RF signals commensurate with said parameters for reception at said remote location.

17. The invention according to claim 16 wherein said weather parameters include lightning flash detection.

18. The invention according to claim 1 wherein said equipment comprises apparatus for acoustic sensing and measurement, and apparatus for detection of corona associated with said conductor.

19. A mobile system for monitoring electrical, physical and/or environmental parameters and conditions associated with or in proximity to an energized electrical power conductor supported by insulators together with at least one lightning shield wire, on a succession of towers extending along a power corridor, said system comprising:
(a) at least one toroidal propulsion module;
(b) means for mounting and removing said toroidal propulsion module to and from said shield wire;
(c) propulsion means powered by current flowing through said conductor for moving said propulsion module upon and along said shield wire;
(d) means for carrying equipment including means for imaging, measuring, sensing and/or recording data commensurate with at least one of said parameters and conditions at selected positions in proximity to said propulsion module as the latter moves along said shield wire;
(e) means for transmitting said data via an RF link; and
(f) means for receiving said data at a location remote from said conductor.

20. The invention according to claim 19 wherein said propulsion means comprises an airborne vehicle and means connecting said vehicle to said propulsion module.

21. The invention according to claim 20 wherein said vehicle is a lighter-than-air vehicle.

22. The invention according to claim 20 wherein said propulsion means includes batteries to power said vehicle.

23. The invention according to claim 22 and further including means for deriving power from said energized conductor for recharging the batteries of said propulsion means.

24. The invention according to claim 20 wherein said propulsion module includes a plurality of hingedly connected sections movable between open and closed positions, and control means operable from a location remote from said conductor and shield wire for moving said sections between said open and closed positions to permit movement of said propulsion module past obstructions on said shield wire.

25. The invention according to claim 19 wherein said equipment is of the type having a viewing direction, and further including means for controlling the direction of view of said equipment by RF control signals transmitted from a ground station.

26. The invention according to claim 25 wherein said equipment comprises a television and/or infrared camera.

27. The invention according to claim 19 wherein said equipment comprises apparatus for detecting one or more weather parameters and means for transmitting RF signals commensurate with said parameters for reception at said remote location.

28. The invention according to claim 27 wherein said weather parameters include lightning flash detection.

29. The invention according to claim 19 wherein said equipment comprises apparatus for acoustic sensing and measurement, and apparatus for detection of corona associated with said conductor.

* * * * *